United States Patent [19]

Keenan

[11] Patent Number: 4,866,434

[45] Date of Patent: Sep. 12, 1989

[54] MULTI-BRAND UNIVERSAL REMOTE CONTROL

[75] Inventor: Douglas M. Keenan, Indianapolis, Ind.

[73] Assignee: Thomson Consumer Electronics, Inc., Princeton, N.J.

[21] Appl. No.: 289,657

[22] Filed: Dec. 22, 1988

[51] Int. Cl.$^4$ .............................................. H04Q 9/00
[52] U.S. Cl. ........................ 340/825.72; 340/825.44; 340/825.69; 340/825.57; 370/109; 375/112; 341/176
[58] Field of Search ...................... 340/825.72, 825.69, 340/825.57, 825.52, 825.44; 358/194.1; 455/603; 341/176; 370/84, 109; 375/109, 112

[56] References Cited

U.S. PATENT DOCUMENTS

| | | | |
|---|---|---|---|
| 4,450,558 | 5/1984 | Hampton et al. | 375/109 |
| 4,623,887 | 11/1986 | Welles, II | 340/825.57 |
| 4,709,227 | 11/1987 | Guerillot | 375/112 |
| 4,728,949 | 3/1988 | Platte et al. | 340/825.69 |
| 4,802,114 | 1/1989 | Sogame | 340/825.72 |
| 4,810,820 | 3/1989 | Davis | 340/825.44 |
| 4,825,200 | 4/1989 | Evans | 455/603 |

FOREIGN PATENT DOCUMENTS

WO86/04476 7/1986 PCT Int'l Appl. ............ 340/825.44

OTHER PUBLICATIONS

Article published Mar. 1988 in Electronics, entitled "What is a Learning Remote Control?".

Primary Examiner—Donald J. Yusko
Assistant Examiner—Brian Palladino
Attorney, Agent, or Firm—Joseph S. Tripoli; Peter M. Emanuel; Thomas F. Lenihan

[57] ABSTRACT

A multi-brand universal remote control handunit stores compressed device control codes to make efficient use of the available memory space. In addition to storing data pointers to pairs of pulse off and pulse burst components of a transmission, the memory also stores data indicative of several characteristics of transmissions within a given brand of device to be controlled.

7 Claims, 4 Drawing Sheets

| | | |
|---|---|---|
| 302 | BPF | BITS PER FIELD |
| 304 | NDF | NUMBER OF DIFFERENT FIELDS |
| 306 | FRQ | CARRIER FREQUENCY INDEX |
| 308 | FPC | FIELDS PER COMMAND |
| 310 | RPT | REPEAT TRANSMISSION SPACING |
| 312 | MARK CYCLES | MARK WIDTH |
| 314 | SPACE WIDTH | SPACE WIDTH |
| 316 | SYNC CYCLES | SYNC WIDTH |
| 318 | F0 SPACE | SPACE OF FIELD # 0 |
| 320 | F0 CYCLES | BURST OF FIELD # 0 |
| 322 | F1 SPACE | SPACE OF FIELD # 1 |
| 324 | F1 CYCLES | BURST OF FIELD # 1 |
| 326 | F2 SPACE | SPACE OF FIELD # 2 |
| 328 | F2 CYCLES | BURST OF FIELD # 2 |
| 330 | F3 SPACE | SPACE OF FIELD # 3 |
| 332 | F3 CYCLES | BURST OF FIELD # 3 |

MULTI-BRAND UNIVERSAL REMOTE CONTROL

FIELD OF THE INVENTION

This invention relates to the field of programmable remote control transmitters for a consumer electronics product such as a VCR, cable converter, videodisc player, television receiver, or the like.

BACKGROUND OF THE INVENTION

A trend in infra-red (IR) remote controls for consumer electronics is the multi-brand universal remote control handunit which controls any one of a number of consumer electronics products manufactured by different manufacturers, and utilizing respective different remote control signal code formats. Universal remote control handunits provide the user with the convenience of using only one remote control handunit, while being able to control most if not all of the functions of the consumer electronics products.

To a large degree, the number of different functions and different remote control command signal formats that can be handled by a universal remote control is dependent upon the amount of memory available for IR code storage.

There are two basic approaches to universal remote control handunits. A volatile memory (RAM) based system is often described as a "learning" remote control handunit. This type of remote control handunit requires the user to "teach" the remote control handunit desired functions from his original handunit. This is usually done by switching the "learning" remote control handunit to a "learning mode", and physically orienting the two handunits such that the "learning" remote control handunit can receive the IR transmissions of the handunit to be emulated. This learning process begins as an information storage process, wherein an IR transmission is recorded as it is being received by the learning remote control. After this initial storage of the "raw" data, the raw data is analyzed and compressed, and then the final compressed version of the data is stored. When the universal remote control handunit is used in the remote control mode to transmit a command, the stored, compressed codes are recalled from memory, decompressed and the resulting signal is transmitted.

A nonvolatile memory (ROM) based system is restricted to a fixed set of devices, usually television receivers (TVs), videocassette recorders (VCRs), and Cable Converters. In such a handunit, all of the different code formats for all of the functions of each type of device to be controlled must be programmed beforehand, and these functions are usually compressed in some manner to occupy as little memory space as possible.

With each technique, since memory space is limited, the more efficient the compression technique used is, the more functions can be stored.

A principal of compression techniques is the identification of common features of IR code formats.

An example of IR data compression is disclosed in U.S. Pat. No. 4,623,887 (Welles II), for use, for example, in a RAM based system. Welles II observed many similarities in various IR formats, and discloses a data compression method employing the classification of a number of characteristics, including duration of carrier "burst", the duration of "spaces" between carrier bursts, and the time between repetitions of transmission information. U.S. patent application Ser. No. 941,468 (Sogame) filed Dec. 15, 1986 discloses a system which further compresses the compressed data produced according to Welles II, by classifying "burst" and "space" pairs into "bin pairs".

SUMMARY OF THE INVENTION

It is herein recognized that there are several other common characteristics or attributes found in most remote control IR code formats which may be employed to produce a significant compression improvement.

Apparatus according to a preferred embodiment of the subject invention utilizing this recognition stores compressed data contiguously in order to save memory space.

DETAILED DESCRIPTION OF THE EMBODIMENT

As used herein, the term "function(s)" refers to the IR transmission or device action associated with a single remote control keypress. The term "command" is synonymous with the term "function". The term "format" refers to the IR code protocol established by a manufacturer. Thus a VCR of a particular manufacturer may be said to have 10 functions, all of which use the same format. The term "field" refers to a space-burst code pair. The term "brand" refers to electronic devices sharing the same code format which are produced by a particular manufacturer.

Figure 1:
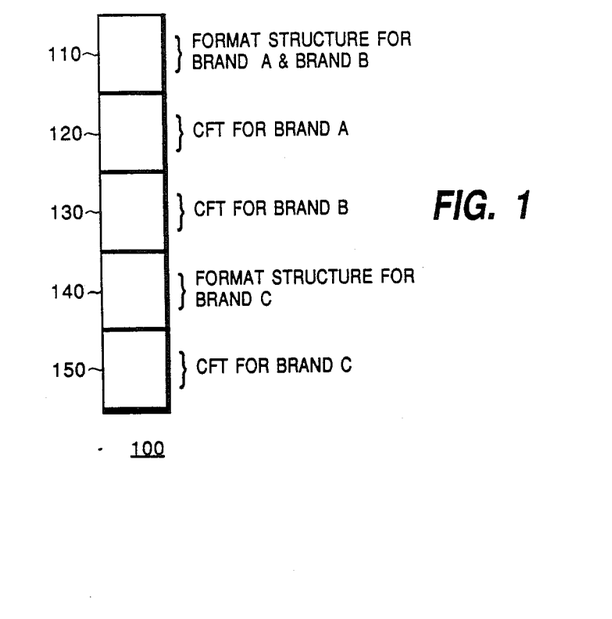
FIG. 1 illustrates the partitioning of memory space of a remote control handunit in accordance with the invention.

A major assumption to be made is that a set of related functions for each device (e.g., PLAY, STOP, RECORD, etc., for a VCR) will be stored in no more than one format, and thus basic format information can be extracted and stored separately for each brand. Storing IR data in the manner illustrated in FIG. 1 provides a great improvement in memory efficiency during data compression. The entire set of compressed data required for each brand is composed of two parts, the format structure (FS), and the compressed function table (CFT).

Each brand must have both of these parts, but many brands can share the same FS, and a few might share the same CFT. To illustrate this point, memory 100 of FIG. 1 comprises an area 110 in which format structure (FS) data for a given brand is stored. The format structure data stored in memory area 110 may be applicable to more than 1 brand (the recognition of which affords an additional memory space saving). A memory area 120 containing a compressed function table (CFT) used by, for example, a Brand A device, is stored in memory immediately following the FS 110 relating to the Brand A device. A memory area 130 containing a compressed function table (CFT) used by, for example, a Brand B device, is stored in memory immediately following the CFT 120 for the brand which is sharing the FS 110. The FS 140 and CFT 150 for a third brand, for example, C, are stored in similar fashion.

Figure 2:
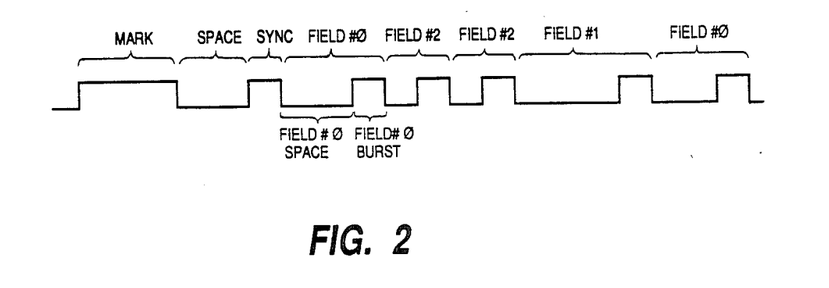
FIG. 2 illustrates the classification of the components of a typical remote control IR transmission in accordance with the invention.

As shown in FIG. 2, an IR transmission is composed of some form of digital envelope that is used to modulate the desired carrier. This envelope consists of a finite and limited number of alternating carrier bursts and spaces. The carrier bursts and spaces can have many different durations (or "widths"). Alternatively, instead of modulating a carrier with the space/burst pairs, the space/burst pairs can be transmitted directly. This type of transmission is said to use a non-carrier format, wherein the envelope is, by definition, the transmission itself. Many formats are initiated by a specific sequence of a burst followed by a space, called a MARK-SPACE sequence (hereinafter MARK-SPACE), which is the same for all functions of a brand. The number of cycles of the carrier burst corresponding to the MARK and the duration of the following SPACE are stored in the FS portion of memory for a given brand (e.g. see 312 and 314 of FIG. 3). (Those formats with no MARK-SPACE may use this memory in the FS for other information). The subject compression technique now assumes that remainder of the envelope can be reduced to a string of sequential of space and burst pairs. Each space/burst pair is called a field, and consists of coded information which contains both the duration of the IR burst (in carrier cycles), and a countdown value which is used to generate the IR space. An IR space is an absence of burst cycles for a specified time. The countdown value is used to control the duration of the desired space. Typically one byte (8 bits) is used to store the burst, and one byte for the space, or two bytes for each field. Thus, the data representative of each type of field used by a particular brand is stored in the FS portion of memory for a given brand. Any IR transmission can be identified as merely a sequence of fields.

Figure 3A:
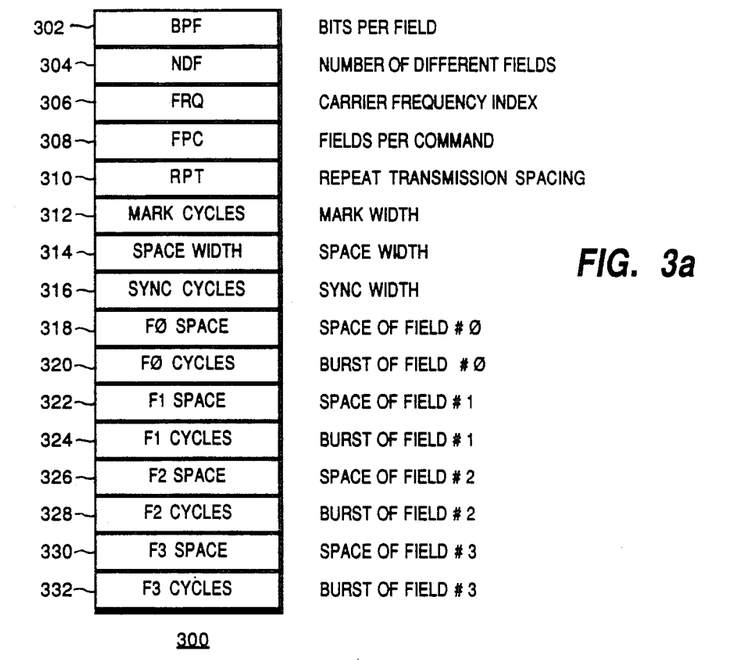
FIG. 3a illustrates in detail a typical Format Structure (FS) such as those Format Structures shown in FIG. 1.

FIG. 3a illustrates the contents of a typical FS portion of memory 300. The contents of the FS portion of memory define the characteristics of a particular IR code format. It comprises some fixed number of constants including encoded information indicating such things as number of bits per field (BPF) 302 (actually the number of bits of a field pointer), number of different fields (NDF) 304, IR carrier frequency (FRQ) 306, fields per command (FPC) 308, spacing (usually given in milliseconds) between repeated transmissions (RPT) 310, and timing data 312-332 concerning burst and space widths.

The FS also contains information concerning the initial burst of carrier in carrier cycles (SYNC) 316. This information is assumed not to change for any function within a brand.

Figure 3B:
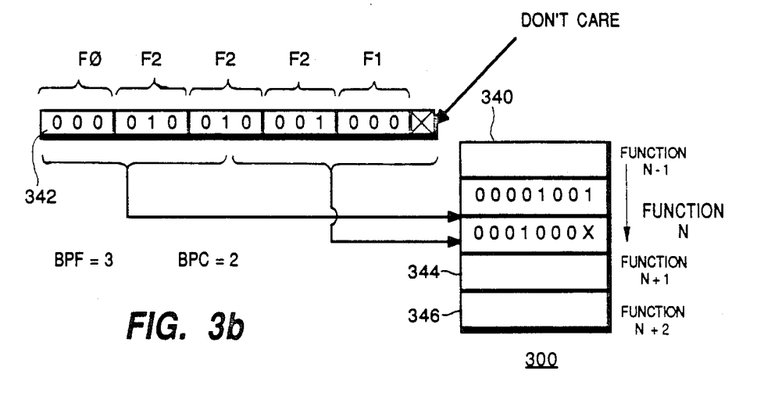
FIG. 3b illustrates in detail a typical Compressed Function Table (CFT) such as those shown in FIG. 1.

As to the IR carrier frequency, the following is noted. Due to the availability of electronic parts, and the nature of IR system design, this frequency is usually in the tens of kilohertz range, and, being generated by simple oscillators, is often one of a subset of about eight "common" carrier frequencies. A microprocessor can simulate any of these with accuracy sufficient for the intended IR receiver, either through using its own clock and a divider, or by simple bit-toggling (as will be shown below with reference to FIG. 4). Note that this definition includes non-carrier formats which use the spacing of bursts of IR (usually on the order of tens of microseconds) to carry information. In these cases, the burst width is considered a constant. FIG. 3b shows a portion of a compressed function table (CFT) for a format in which there are 3 bits per field (BPF) and 2 bytes per command (BPC). The compressed function table (CFT) consists of a block of memory 340-346 which contains a set of compressed field data in the form of address "pointers" to locations in the FS where the field data is actually located for all functions of a particular brand. An inventive feature is that the field pointers are stored sequentially, across byte boundaries in order to save memory space.

Each "pointer" (3 bits in this example) points to a single field stored in the FS. For example, the three bits of field pointer 0 (F0) of function location 342 point to the corresponding memory area containing memory locations 318,320 (FIG. 3a) which define field 0 in terms of duration of the space and number of burst cycles following the space. In this example, function location 342 comprises 2 bytes of memory (i.e. bytes per command (BPC)=2).

Bits per field (BPF) in general, is the number of bits which must be stored in the CFT in order that each of the fields of the FS portion of memory can be addressed.

For example, with 3 bits per field, 8 fields (i.e. 0-7) can be uniquely addressed. It is important to note that if BPF were not stored, then each field pointer memory location in the CFT portion of memory would need to be the same fixed number of bits in length, and the fixed number of bits would have to be set to the number of bits necessary to access the FS memory having the greatest number of fields. Most likely this number would be set at 8 bits for convenience, since 8 bits constitute an easily addressable byte of memory. However, if a format needs only 3 bits per field pointer, the extra 5 bits of space reserved would be wasted. By storing the bits per field (BPF), the field pointers stored in the CFT may be "packed" together (i.e. stored contiguously) across byte boundaries (as shown in the detail 342 of FIG. 3b), thus conserving memory space. The controller accessing the CFT memory "knows", by virtue of the stored BPF, exactly how many bits to read out for addressing each field stored in the FS memory.

As noted above, the FS memory contains data which defines each of the fields used within a given brand. Each function (i.e. command to be transmitted) comprises a unique combination of fields selected from those stored in the FS. Thus, in order to form a particular sequence of fields in preparation for an IR transmission, the field definition area (e.g. 320-322 of FIG. 3) of the FS memory is addressed by a particular sequence of pointers stored in the CFT. In other words, the CFT does not, per se, contain information about the burst cycles and spaces to be transmitted, but rather contains pointers to the locations in the FS memory where that information may be found.

The number of different fields (NDF) used by any IR format varies. Many formats use only two different fields, while others use as many as twelve. However, within a given format this number is constant, and is stored in memory location 308 in the FS portion of memory 300 and is used to find the start of the CFT portion of memory, since the CFT portion of memory immediately follows the FS portion of memory, and is therefore 2 x NDF memory locations after the SYNC CYCLES location in memory 300 (See FIG. 3). Another constant stored in the FS portion of memory is the number of fields that compose each function, or fields-per-command (FPC) 308. In practice, FPC may vary anywhere from 5 to 32 fields. Note that the total number of functions of a format cannot exceed NDF X FPC functions, and is usually much less. A set of equations which may be useful in understanding the invention is presented below in TABLE 1.

Although the number of bits (BPF) allocated in the CFT to point to each field and stored in FS memory location 302 might be assumed to be equal to the minimum number of bits necessary to address each of the different fields, this is not so in all cases. A BPF value greater than that required to address all of the different fields is sometimes provided to allow pointing to fields that do not exist. This is done because some IR formats keep total transmission time constant by changing the number of fields per function (i.e. by varying the FPC). That is, in these formats, when a transmission comprises fields having long durations, then fewer fields are sent. The present compression technique compensates for this by allocating the maximum number of fields used by any function for the particular format as NDF for the entire format (i.e., for each function), and "pads" the difference with field pointers larger than NDF. Thus, upon decompression, there are two ways to terminate a transmission: either transmit the FPC number of fields, or encounter a field numbered greater than the value of NDF. Note that by storing NDF, it is unnecessary to store a "trailer" value to indicate the end of the field storage area.

In addition to the above, several other memory saving factors are herein recognized. For example, the information stored in the FS can be bit-mapped into a small number of bytes, that is, the data in the FS can be stored contiguously as it is in the CFT portion of memory. In many formats, the complement of a message is also sent for error checking. In this case a complement indication (flag) can be stored, and pointers to the complements eliminated from the CFT for efficiency of storage. These complements can be generated for transmission at decompression in response to the stored complement flag.

Figure 4:
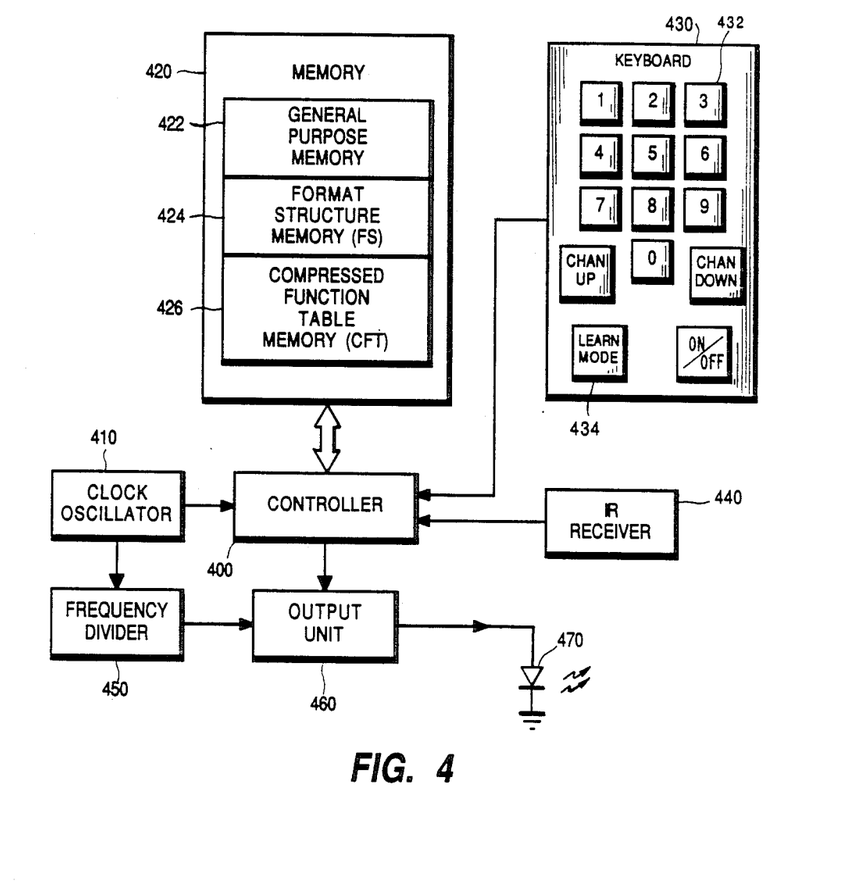
FIG. 4 illustrates, in block diagram form, remote control handunit circuitry suitable for use with the invention.

An apparatus, for a remote control handunit suitable for use with one embodiment of the invention, is shown in FIG. 4. A controller 400 may be a microprocessor (the terms microprocessor and microcomputer as used herein have the same meaning).

Controller 400 receives, from clock oscillator 410, clock signals which establish the timing of the functions of controller 400. Controller 400, in accordance with its programmed instructions, addresses a memory 420 which may or may not be internal to controller 400. Memory 420 includes a general purpose (or scratch pad) area 422, an area for storing the above-mentioned FS data 424, and an area for storing the above-mentioned CFT data 426. Controller 400 also receives data entered by a user via a keyboard 430 comprising a group of keys 432 including digit keys 0-9, a channel up key, a channel down key, and a power ON/OFF key. Keyboard 30 may also include a switch for entering the above-mentioned "learning mode". This switch is shown on keyboard 430 as a key 434, however, it may be a separate toggle switch located elsewhere on the remote control handunit. In the illustrated embodiment of FIG. 4, key 434 is assumed to exhibit "toggle" characteristic. That is, one pressing of key 434 causes the learning mode to be active, and a second pressing of key 434 returns the remote control handunit to the normal remote control mode, wherein user commands may be sent to the controllable devices.

When in the learning mode, IR receiver 440 receives IR signals transmitted by the remote control handunits to be emulated, and provides digital data representative of those IR signals to controller 400. Controller 400 stores the "raw" (i.e. uncompressed) data in general purpose memory 422, extracts the format structure representative data and stores it in FS memory 424, and compresses the command-related data into compressed function data and stores it in the CFT memory 426.

When in the normal remote control mode, and when a transmission of a command is desired, controller 400 decompresses the stored function data and passes the data to an output unit 460 which assembles the proper sequence of bursts and spaces for transmission. Clock oscillator 410 also proves signals to a frequency divider 450 which provides lower frequency signals to output unit 460. These lower frequency signals are gated into the data stream in output unit 460 and form the burst component of the data stream which is applied to IR diode 470 for transmission.

In the alternative, frequency divider 450 may be eliminated, the burst pulses being generated by controller 400 by "toggling" an output rapidly.

In ROM based systems the compression algorithm is not performed in the remote control handunit, but rather was performed at an earlier time in the factory in order to generate the FS and CFT codes for programming into a ROM. In this case, IR receiver 440 and "learn mode" key 434 could be eliminated from the remote control handunit.

Decompression and transmission of the stored remote control function data will now be explained with respect to FIGS. 4, 5a and 5b. When a user operates the keyboard 430 of remote control handunit to transmit a command to a selected device, controller 400 under control of a program stored in program memory (ROM) 402 sets a pointer to the appropriate command to be issued and enters the portion of the program shown in flowchart form in FIG. 5a.

As a matter of programming convenience, it is desirable to always copy the FS to be addressed into the same "working space" in general purpose memory 422 (step 515). A portion of the copied FS is illustrated in FIG. 5b, and is addressed by a pointer (also known as an index). It is also convenient to always copy the relevant function code from the CFT portion of memory to the same "working space" in general purpose memory 422 (step 520) in preparation for decompression.

The period of 1 cycle of burst is fetched (step 525), and the MARK value is also fetched (step 530) from the FS. If the MARK value not zero, then a transmission must include a MARK component (as shown in FIG. 2). The burst value is fetched (in this case the MARK value), the number of cycles needed to generate the proper length MARK is computed and the MARK transmitted (step 570).

In the event that the MARK value is equal to zero, then the transmission would start with a space. This is done by clearing the index (step 540) which points the index to the SPACE portion of the copied FS. The index is loaded during data decompression with field numbers from the copied CFT function. The index value is doubled (step 545) to ensure that the index points to a SPACE at the beginning of each field. For example, field number 3 begins at the sixth storage location because each field includes a SPACE memory location and a Burst Memory location. The space value addressed by the index is fetched from the FS (step 550) and examined to see if it is zero (step 555).

It is herein recognized that additional memory space can be conserved by storing the square root of the desired SPACE duration rather than storing the SPACE duration itself. Thus, in step 560 the value stored in SPACE is squared before being loaded into a SPACE duration timer (step 565). The SPACE duration timer may be a software function within microcomputer 400, or may be a hardware timer either within or outside of microcomputer 400.

When the SPACE period has expired, the BURST value stored immediately following the current SPACE value is fetched and the proper number of cycles transmitted (step 570).

The function field pointer (which is pointing to the field numbers (e.g. F$\phi$,F2,F2,F1,F$\phi$ of the copied CFT function) is incremented (step 575) and checked to see if it is equal to the number of Fields Per Command (FPC) (step 580).

If the function field pointer value is not equal to the total number of Fields Per Command, then the next field number is fetched from the copied command (stop 590).

If the fetched field number is greater than the total Number of Different Fields (NDF) (step 595) then this number would point, when doubled, to a non-existent field. In this event, as mentioned above, the transmission terminates, otherwise the newly fetched field number is doubled (step 545) (to point it to the proper FS memory location), and the transmission continues.

TABLE 1

Bits per Field (BPF) = INT $(\log_2 (NDF - 1)) + 1$  (1)
Where INT means "take only the integer portion of the result.

$$\text{Bytes per Command (BPC)} = \text{INT}\left(\frac{((BPF \times FPC) - 1)}{8}\right) + 1 \quad (2)$$

FORMAT STRUCTURE
FS = BPF + NDF + FRQ + FPC + RPT + MRK + SPC + SYN + 2 × NDF   (3)
= 1 + 1 + 1 + 1 + 1 + 1 + 2 + 1 + 2(NDF)
= 9 + 2(NDF) bytes
COMPRESSED FUNCTION TABLE (CFT) = BPC × N   (4)
where N is number of functions EFFICIENCY OF STORAGE = $\frac{FS + CFT}{N}$   (5)

= $\frac{9 + 2(NDF)}{N}$ + BPC

Where Efficiency of Storage is expressed in bytes/function.

Subtracting 1 bit from the product of BPF X FPC in equation (2) prevents the crossing of byte boundaries from affecting the calculation of the value of BPC, and thereby prevents an unnecessary increase in the value of BPC. Using the "INT" function rounds the result to a whole number of bytes, and adding 1 byte ensures that BPC is always greater than zero. This constant is useful in decompressing the CFT, and rather than storing it, it can be calculated at decompression time. For N functions, the size of the CFT is BPC×N bytes.

While the invention has been described with reference to an IR remote control handunits, the scope of the claimed invention is intended to encompass ultrasonic remote control handunits as well.

Figure 5A:
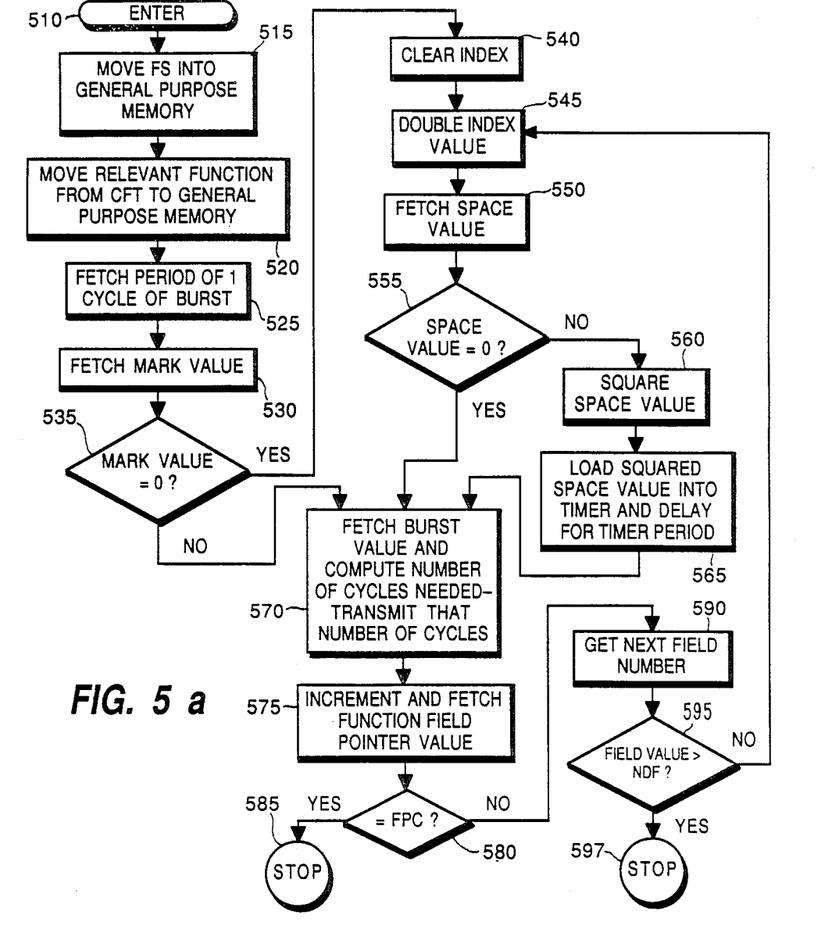
FIG. 5a is a flowchart showing a code decompression program suitable for use with the invention.
Figure 5B:
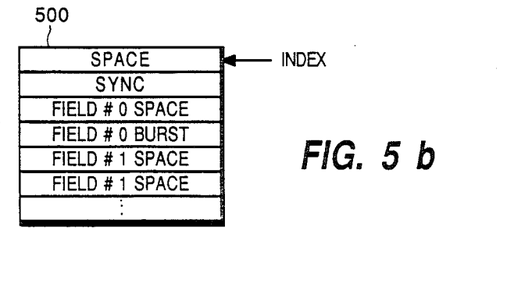
FIG. 5b illustrates a portion of general purpose memory having FS data stored therein.

The decompression routine illustrated in the flowchart of FIG. 5a is equally applicable to a RAM-based (learning type) remote control, and the scope of the claims is intended to encompass both learning and non-learning remote control handunits.

What is claimed:

1. For use in a remote control system, remote control transmitter apparatus for transmitting a selected type of a plurality of different types of remote control signals, each including bursts of carrier cycles separated by spaces, and each corresponding to a selected function of a plurality of functions, comprising:
   first memory means including a plurality of memory locations for storing coded data corresponding to pairs of said burst carrier cycles and spaces;
   second memory means including a plurality of memory locations having a given number of bits per memory location for storing coded data corresponding to the addresses of said memory locations of said first memory means, said coded data being dependent on said selected function of a first selected type of remote control signal,
   third memory means including memory locations for storing coded data representative of the partitioning of said memory locations of said second memory means into groups of bits less than said given number of bits of said memory locations of said second memory means, dependent on the selected type of remote control;
   control means responsive to said coded data stored in said second and third memory for reading out the coded data stored in said first memory means and in response thereto generating said selected type of remote control.

2. The transmitter apparatus recited in claim 1 wherein:
   said coded data stored in said third memory means is dependent on the number of different pairs of burst carrier cycles and spaces of said selected type of remote control signals.

3. The transmitter apparatus recited in claim 1 wherein:
   said coded data stored in said second memory means is stored contiguously.

4. The apparatus of claim 3 further comprising:
   a fourth memory means including a plurality of memory locations having a given number of bits per memory location for storing coded data corresponding to the addresses of said memory locations of said first memory means, said coded data being dependent on a selected function of a second type of remote control signal.

5. The apparatus of claim 4 wherein each of said plurality of different types of remote control signals corresponds to a respective brand of remotely controlled equipment.

6. The apparatus of claim 5 wherein said coded data of said second and fourth memory means is stored contiguously.

7. A remote control transmitter for controlling various devices each of which may utilize a different one of a plurality of control code transmission formats, each of said formats exhibiting characteristics including number of different fields employed, fields per command, and bits per field, comprising:

keyboard means for entering control data for controlling one of said devices;

memory means for storing data comprising field code pointers, wherein each of said field code pointers is an address pointer to a pair of field codes comprising a first code representing a type of pulse off component of a remote control signal and a second code representing a type of pulse burst component of said remote control signal, said signal having a given one of said transmission formats;

said memory means also storing additional data indicative of at least one of said format characteristics determining the timing of said pulse off and said pulse burst components;

addressing means for addressing, in response to said additional data, an area of said memory means, containing said field code pointers which corresponds to said one of said plurality of control code transmission formats utilized by said devices to be controlled;

means for generating data for transmission by reading from said memory means said data representative of pulse off and pulse burst components of said one of said control code transmission formats in accordance with said stored field code pointers; and transmitting means for receiving said data and for transmitting said data in said one of said plurality of transmission formats for controlling said devices to be controlled.

* * * * *

UNITED STATES PATENT AND TRADEMARK OFFICE
CERTIFICATE OF CORRECTION

PATENT NO.   :   4,866,434

DATED        :   September 12, 1989

INVENTOR(S)  :   DOUGLAS MARVIN KEENAN

It is certified that error appears in the above-identified patent and that said Letters Patent is hereby corrected as shown below:

On the Title Sheet, under References Cited, U.S. PATENT DOCUMENTS, that portion reading "4,810,820" should read -- 4,816,820 --

Signed and Sealed this

Twentieth Day of November, 1990

Attest:

HARRY F. MANBECK, JR.

*Attesting Officer*     *Commissioner of Patents and Trademarks*